United States Patent [19]
Benhamida

[11] Patent Number: 5,369,377
[45] Date of Patent: Nov. 29, 1994

[54] CIRCUIT FOR AUTOMATICALLY DETECTING OFF-CHIP, CRYSTAL OR ON-CHIP, RC OSCILLATOR OPTION

[75] Inventor: Boubekeur Benhamida, Boise, Id.

[73] Assignee: Zilog, Inc., Campbell, Calif.

[21] Appl. No.: 136,291

[22] Filed: Oct. 13, 1993

[51] Int. Cl.$^5$ .................. H03B 5/34; H03K 17/56
[52] U.S. Cl. ........................ 331/49; 331/59; 331/64; 331/108 D
[58] Field of Search ............ 331/49, 59, 64, 108 D, 331/111, 158

[56] References Cited

U.S. PATENT DOCUMENTS 5,093,633  3/1992  Benhamida ................... 331/59
5,151,613  9/1992  Satou et al. ................. 331/49 X

*Primary Examiner*—Siegfried H. Grimm
*Attorney, Agent, or Firm*—Majestic, Parsons, Siebert & Hsue

[57] ABSTRACT

A self-configurable clock circuit which automatically detects at power up whether an off-chip crystal oscillator is connected to an integrated circuit including the self-configurable clock circuit, and following such detection generates a system clock signal and a power on reset signal to be used by other circuitry included in the integrated circuit. If the off-chip crystal oscillator is connected to the integrated circuit, then the self-configurable clock circuit provides the system clock signal from a first signal generated from the off-chip crystal oscillator. On the other hand, if the off-chip crystal oscillator is not connected to the integrated circuit, then the self-configurable clock circuit provides the system clock signal from a second signal generated from an on-chip RC oscillator circuit.

18 Claims, 8 Drawing Sheets

CIRCUIT FOR AUTOMATICALLY DETECTING OFF-CHIP, CRYSTAL OR ON-CHIP, RC OSCILLATOR OPTION

BACKGROUND OF THE INVENTION

This invention relates in general to techniques for generating on-chip clock signals in an integrated circuit ("IC") and in particular, to a technique and on-chip circuit for automatically detecting at power up whether an off-chip crystal oscillator or an on-chip RC oscillator has been selected to generate a system clock signal for other on-chip circuitry, and then providing the system clock signal generated from the selected oscillator to the other on-chip circuitry.

U.S. Pat. No. 5,093,633, entitled "Externally Trimmed Integrated-Circuit RC Oscillator," and incorporated herein by reference, discloses a technique invented by the inventor of the present invention, which selects through a mask programmable option in the manufacturing process, either an off-chip crystal oscillator or an on-chip RC oscillator option for generating an on-chip system clock signal. Using the technique disclosed therein, once the selected option is mask programmed onto the IC at the IC manufacturer's factory, the selected option becomes permanent.

OBJECTS AND SUMMARY OF THE INVENTION

It is sometimes desirable that the selection of the crystal or RC oscillator option be done at the customer's facility rather than the manufacturer's factory. Such a feature, for example, would facilitate more efficient inventory control. It is also sometimes desirable that the selection of the crystal or RC oscillator option be reselectable. By not making the selection of the crystal or RC oscillator option permanent, such a feature, for example, would also more readily accommodate system design changes without having to replace the IC, as well as facilitate more efficient inventory control by not having to discard the previously programmed ICs.

To make the selection of the crystal or RC oscillator option at the customer's facility simple, it would be desirable to allow the customer to make such a selection by merely connecting or not connecting an off-chip crystal oscillator to the IC. Thereupon, if the off-chip crystal oscillator is connected to the IC, then the system clock signal should be generated from the off-chip crystal oscillator, and if the off-chip crystal oscillator is not connected to the IC, then the system clock signal should be generated from the on-chip RC oscillator circuit.

Accordingly, one object of the present invention is to provide an on-chip, self-configurable clock circuit which can automatically detect at power up whether or not an off-chip crystal oscillator is connected to an integrated circuit including the self-configurable clock circuit, and generate a system clock signal for other circuitry on the integrated circuit upon such detection, wherein if the off-chip crystal oscillator is connected to the IC, then the system clock signal is generated from the off-chip crystal oscillator, and if the off-chip crystal oscillator is not connected to the IC, then the system clock signal is generated from the on-chip RC oscillator circuit.

This and additional objects are accomplished by the various aspects of the present invention, wherein briefly stated, one aspect of the invention is an on-chip, self-configurable clock circuit which includes an edge detection means for receiving a signal originating from a source connected to at least one package pin, which an off-chip crystal oscillator is connectable to, and detecting whether a state transition occurs on the received signal. If a state transition occurs on the received signal, then the off-chip crystal oscillator is determined to be connected to the at least one package pin by a logic circuit connected to the edge detection means, and the system clock signal is thereupon generated from the received signal by the logic circuit. On the other hand, if a state transition does not occur on the received signal, then the off-chip crystal oscillator is determined to not be connected to the at least one package pin by the logic circuit, and the system clock signal is thereupon generated from an on-chip RC oscillator.

Another aspect of the present invention is a method of selecting as a system clock signal for an integrated circuit chip either a first clock signal generated from an off-chip crystal oscillator if the off-chip crystal oscillator is connected to an input of the integrated circuit chip, or from a second clock signal generated from an on-chip R-C oscillator circuit if the off-chip crystal oscillator is not connected to the input of the integrated circuit chip, wherein the method comprises the steps of: detecting a state transition of the first clock signal; and selecting as the system clock signal the first clock signal if the state transition is detected, or the second clock signal if the state transition is not detected.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1:
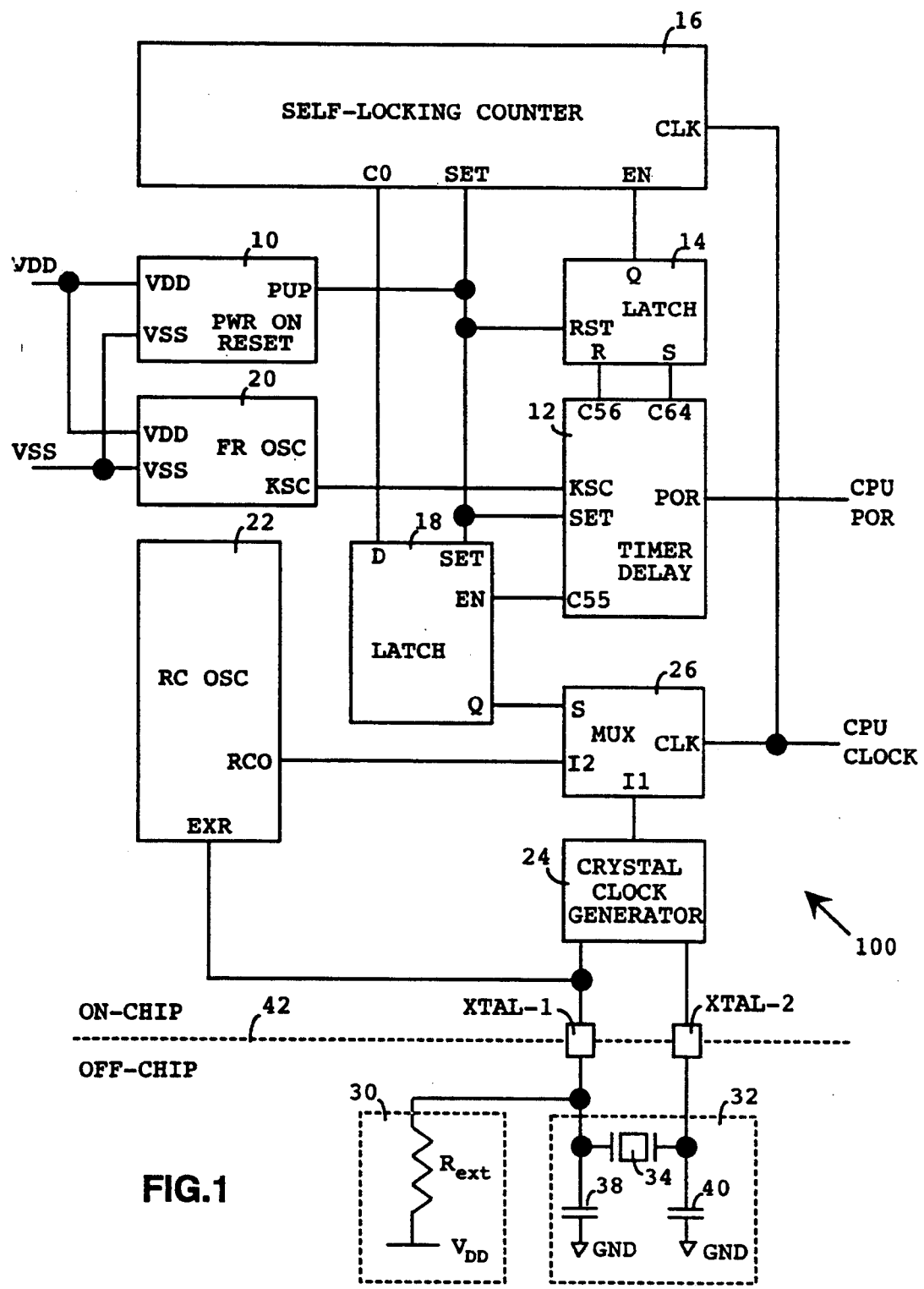
FIG. 1 illustrates a block diagram of an on-chip, self-configurable clock circuit utilizing aspects of the present invention.

FIG. 1 illustrates a preferred embodiment of an on-chip, self-configurable clock circuit 100 which provides, for the use of other circuitry (not shown) on the chip, a system clock signal ("CPU CLOCK") and a power on reset signal ("CPU POR"). The circuit 100 is called self-configurable, because it automatically determines at power up, whether or not an off-chip, crystal oscillator circuit 32 is connected to it through pins XTAL-1 and XTAL-2, and upon such determination, provides the CPU CLOCK from either a first clock signal originating from the off-chip, crystal oscillator circuit 32, if the off-chip, crystal oscillator circuit 32 is connected to it through pins XTAL-1 and XTAL-2, or a second clock signal originating from an on-chip, RC oscillator ("RC OSC") circuit 22 in combination with an off-chip, resistor circuit 30, if the off-chip, crystal oscillator circuit 32 is not connected to it through pins XTAL-1 and XTAL-2. Also after such determination, the self-configurable clock circuit 100 generates the CPU POR to indicate to the other circuitry (not shown) on the chip that the CPU CLOCK is available for use.

A dotted line 42, acting as a line of demarcation between on-chip and off-chip components, is shown in FIG. 1 to facilitate the identification of on-chip and off-chip components. Pins XTAL-1 and XTAL-2 are shown residing on the dotted line, because they act as communication links between the on-chip and the off-chip circuit elements or components shown in the figure. Also, although both circuits 30 and 32 are shown in the figure, it is to be understood that in actual operation, only one of the two circuits is connected to pins XTAL-1 and XTAL-2.

In the preferred embodiment of the invention, an external (wherein the terms "external" and "off-chip" are herein used synonymously) crystal a resonator 34 is connectable across pins XTAL-1 and XTAL-2 with capacitors 38 and 40 both connected at one end to ground and at other ends to pins XTAL-1 and XTAL-2, respectively, to form the off-chip, crystal oscillator circuit 32. If the external resonator oscillator 34 is not connected across pins XTAL-1 and XTAL-2, an external precision resistor $R_{ext}$ is preferably connected between pin XTAL-1 and a voltage source $V_{DD}$ to form the off-chip, resistor circuit 30 which is used in combination with the internal (wherein the terms "internal" and "on-chips" are herein used synonymously) RC oscillator circuit 22.

Although the preferred embodiment of the present invention provides for a voltage source $V_{DD}$ to be connected to pin XTAL-1 through an external precision resistor $R_{ext}$, when the external crystal resonator 34 is not connected across pins XTAL-1 and XTAL-2, it is to be understood that the present invention does not rely upon such connection. Accommodation for the external precision resistor $R_{ext}$ is provided so that the frequency of the RC OSC circuit 22 can be externally adjusted. If such adjustment is not necessary, then it will be appreciated that the RC OSC circuit 22 can readily be modified to connect to the voltage source $V_{DD}$ through another pin, and nothing need be connected to pin XTAL-1 if the external crystal resonator 34 is not connected across pins XTAL-1 and XTAL-2.

At power up or reset, the self-configurable clock circuit 100 is activated by power being applied to an on-chip, power-on/reset pulse generator ("PWR ON RESET") circuit 10 by electrically connecting through switching or other means not shown in the figure, voltage supplies, $V_{DD}$ and $V_{SS}$, to respective inputs, VDD and VSS, of the PWRON RESET circuit 10. In response to this connection of power, the PWR ON RESET circuit 10 generates at output PUP, a single pulse having a pulse width, for example, of 100 μsec. The PUP output of the PWRON RESET circuit 10 is then connected to a set input ("SET") of an on-chip, timer delay and counter ("TIMER DELAY") circuit 12, a reset input ("RST") of an on-chip, R-S latch circuit 14, a set input ("SET") of an on-chip, self-locking counter circuit 16, and a set input ("SET") of an on-chip, transparent D-latch circuit 18.

Concurrently, when power is switchably connected to the PWR ON RESET circuit 10, it is also applied to a free running oscillator ("FR OSC") circuit 20 by switchably connecting, for example, the voltage supplies, $V_{DD}$ and $V_{SS}$, to respective inputs, VDD and VSS, of the FR OSC circuit 20. The FR OSC circuit 20 thereupon starts to oscillate at a preselected frequency (e.g., $f_{FRO}$), and generate at such frequency, a free running clock signal at its output KSC. Preferably, the preselected frequency, $f_{FRO}$, is chosen to be much slower (e.g., 1 MHz.) than the expected clock frequency (e.g., 10–50 MHz.) generated from either the crystal oscillator circuit 32, or the RC oscillator circuit 22 in combination with the external resistor circuit 30.

When the pulse generated at the PUP output of the PWR ON RESET circuit 10 is received at the SET input of the TIMER DELAY circuit 12, a self-locking counter circuit (e.g., 120 in FIG. 3) in the TIMER DELAY circuit 12 is set to an initial count value, for example, FF hex (e.g., 556 decimal) for an 8-bit counter. At the same time, outputs C64, C56 and C55 of the TIMER DELAY circuit 12 are each initially set to a logic LOW state, and output POR of the TIMER DELAY circuit 12 is initially set to a logic HIGH state.

When the pulse generated at the PUP output of the PWR ON RESET circuit 10 is received at the SET input of the self-locking counter 16, a counter circuit (not shown) in the self-locking counter 16 is also set to an initial count value, for example, F hex (e.g., 16 decimal) for a 4-bit counter, and output C0 of the self-locking counter 16 is initially set to a logic LOW state.

Finally, when the pulse generated at the PUP output of the PWR ON RESET circuit 10 is received at the RST input of the R-S latch 14, a Q output of the R-S latch 14 is reset to logic LOW, and when the pulse generated by the PWR ON RESET circuit 10 is received at the SET input of the transparent D-latch 18, a Q output of the transparent D-latch 18 is initially set to logic HIGH.

The Q output of the transparent D-latch 18 is connected to a select input S of a multiplexer ("MUX") 26. When the select input S is in a logic HIGH state, MUX 26 passes a clock signal (also referred to herein as "first clock signal" or "crystal clock signal") received at its input I1 from a crystal clock generator 24, to its output CLK which provides the CPU CLOCK to the other circuitry (not shown) on the chip. On the other hand, when the select input S is in a logic LOW state, MUX 26 passes a clock signal (also referred to herein as "second clock signal" or "R-C oscillator clock signal") received at its input I2 from the RC OSC circuit 22, to its output CLK. Since the Q output of the transparent D-latch 18 is initially set to logic HIGH, MUX 26 initially passes the crystal clock signal received at its input I1 to its output CLK.

Figure 2:
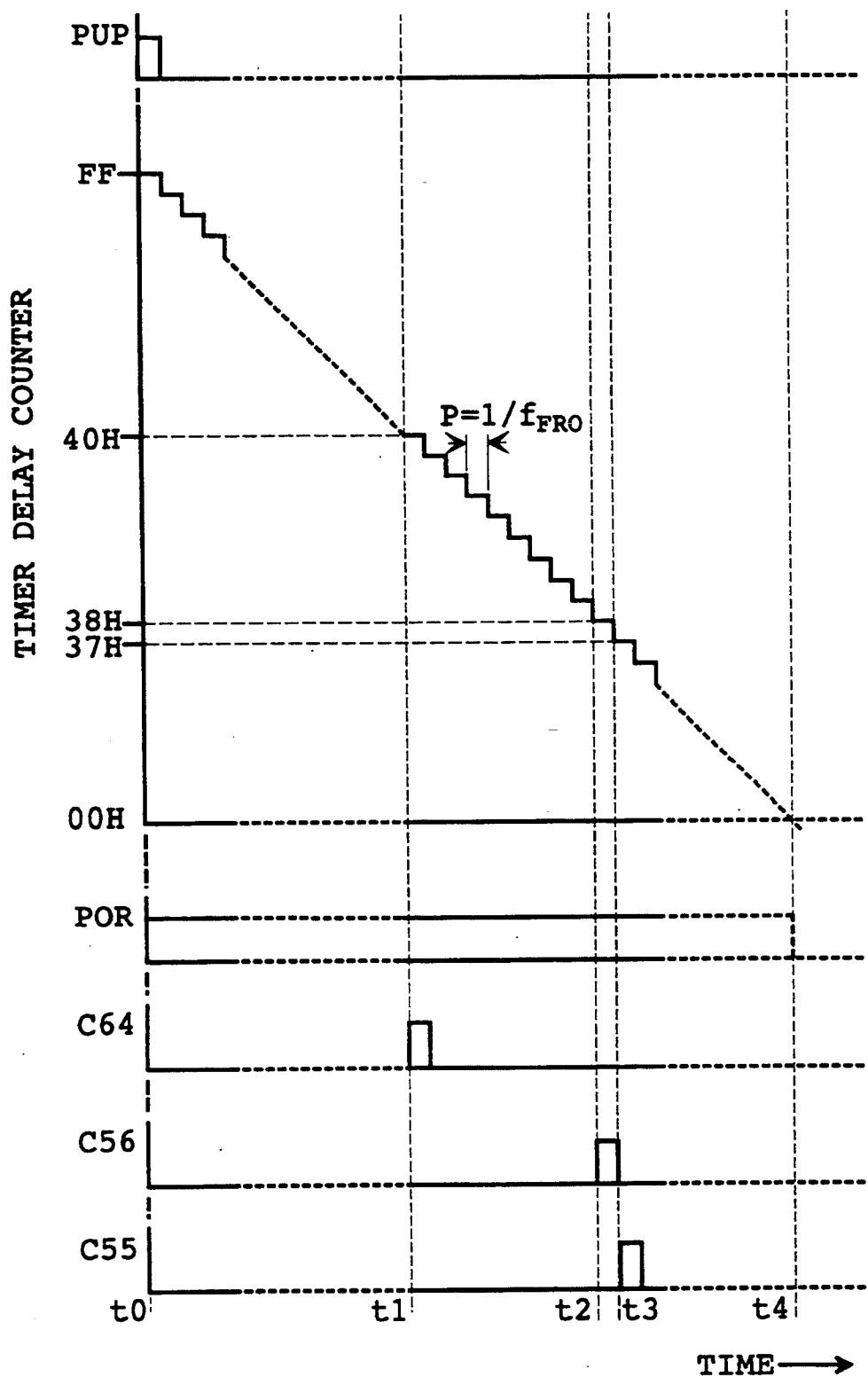
FIG. 2 illustrates, as examples, timing diagrams related to the timer delay block of the on-chip, self-configurable clock circuit of FIG. 1.

FIG. 2 illustrates, as examples, timing diagrams related to the inputs to and outputs of TIMER DELAY circuit 12. When power is applied to the PWR ON RESET circuit 10 at time t0, the PWRON RESET circuit 10 generates, as previously described, a single pulse, and transmits that generated single pulse to the SET input of the TIMER DELAY circuit 12. When received at the SET input of the TIMER DELAY circuit 12, the generated pulse then initializes a timer delay counter (e.g., 120 in FIG. 3) in the TIMER DELAY circuit 12 to FF hex, for example, and causes the POR output of the TIMER DELAY circuit 12 to be initialized to a logic HIGH state.

The timer delay counter (e.g., 120 in FIG. 3) in the TIMER DELAY circuit 12 thereupon decrements one count in response to each clock pulse of the free running clock signal which is provided to the timer delay counter (e.g., 120 in FIG. 3) through an input KSC of the TIMER DELAY circuit 12 from the KSC output of the FR OSC circuit 20. At time t1, the count of the timer delay counter (e.g., 120 in FIG. 3) has decremented down to a count of 64 decimal (40 hex), and the TIMER DELAY circuit 12 thereupon generates a pulse at its output C64. At time t2, the count of the timer delay counter (e.g., 120 in FIG. 3) has decremented down to a count of 56 decimal (38 hex), and the TIMER DELAY circuit 12 thereupon generates a pulse at its output C56. At time t3, the count of the timer delay counter (e.g., 120 in FIG. 3) has decremented down to a count of 55 decimal (37 hex), and the TIMER DELAY circuit 12 thereupon generates a pulse at its output C55. Finally, at time t4, the count of the timer delay counter (e.g., 120 in FIG. 3) has decremented down to a count of zero (00 hex) where it locks, and the TIMER DELAY circuit 12 thereupon causes the power on reset signal CPU POR to go LOW, indicating to the other circuitry (not shown) on the chip, that the system clock signal CPU CLOCK is now available for use.

Figure 3:
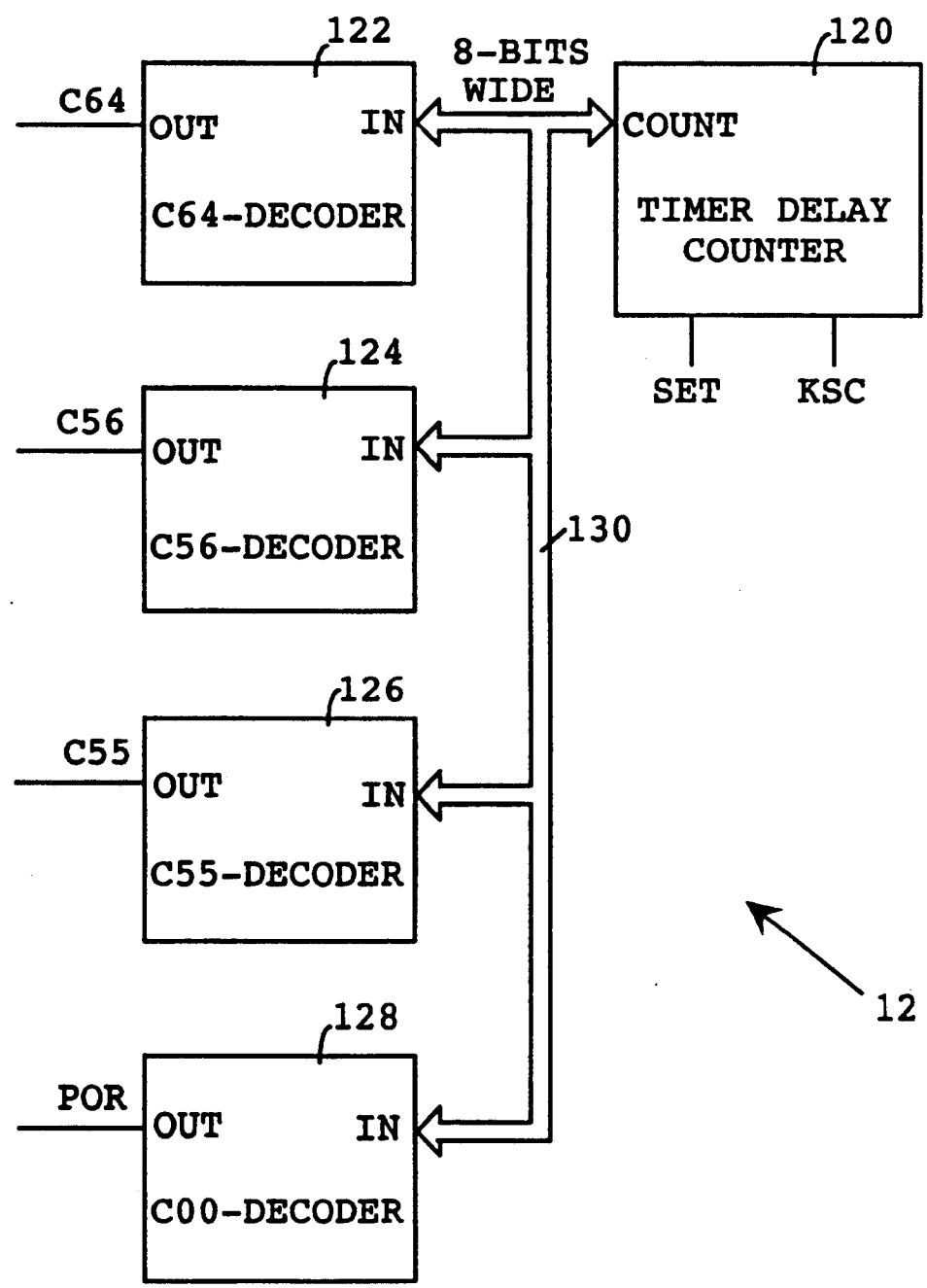
FIG. 3 illustrates, as an example, a more detailed block diagram of the timer delay block of the on-chip, self-configurable clock circuit of FIG. 1.
Figure 4A:
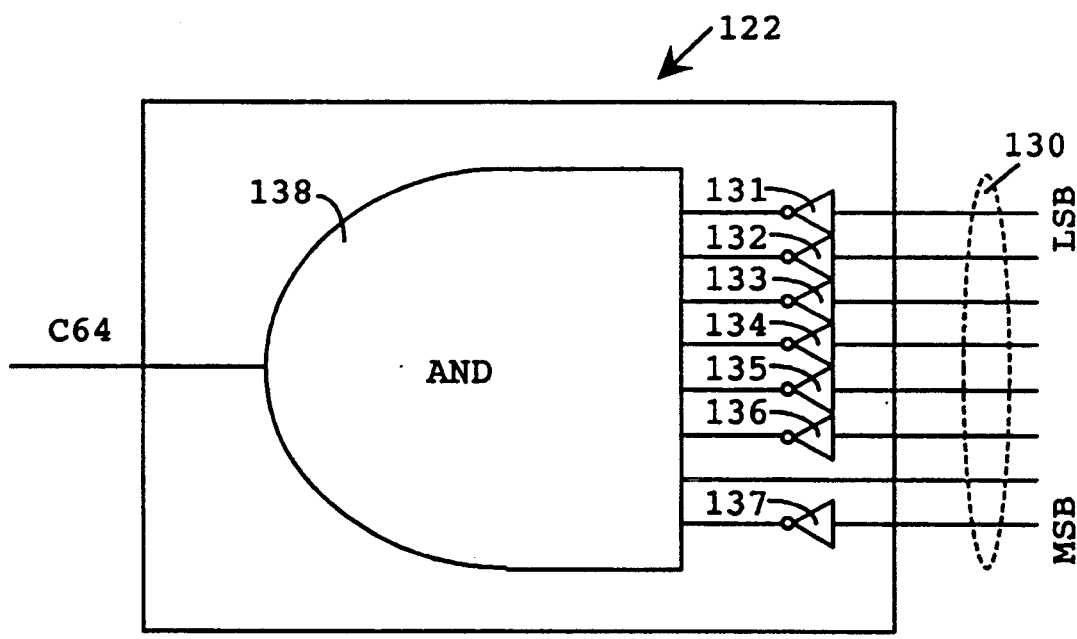
FIGS. 4A–D illustrate, as examples, logic diagrams of the decoder blocks of FIG. 3.
Figure 4B:
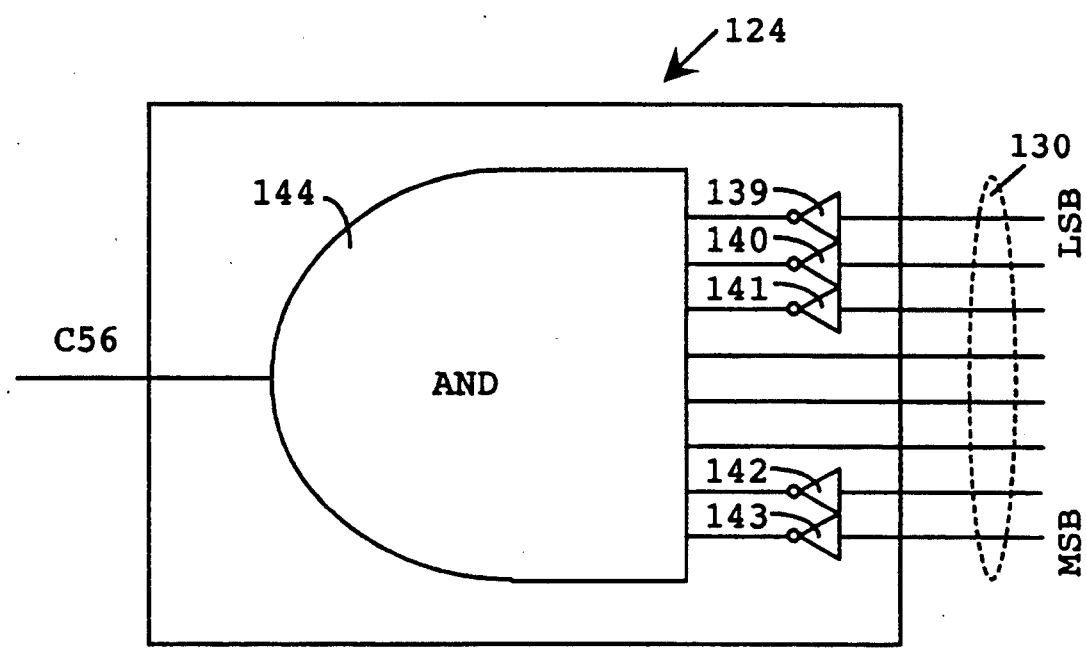
Figure 4C:
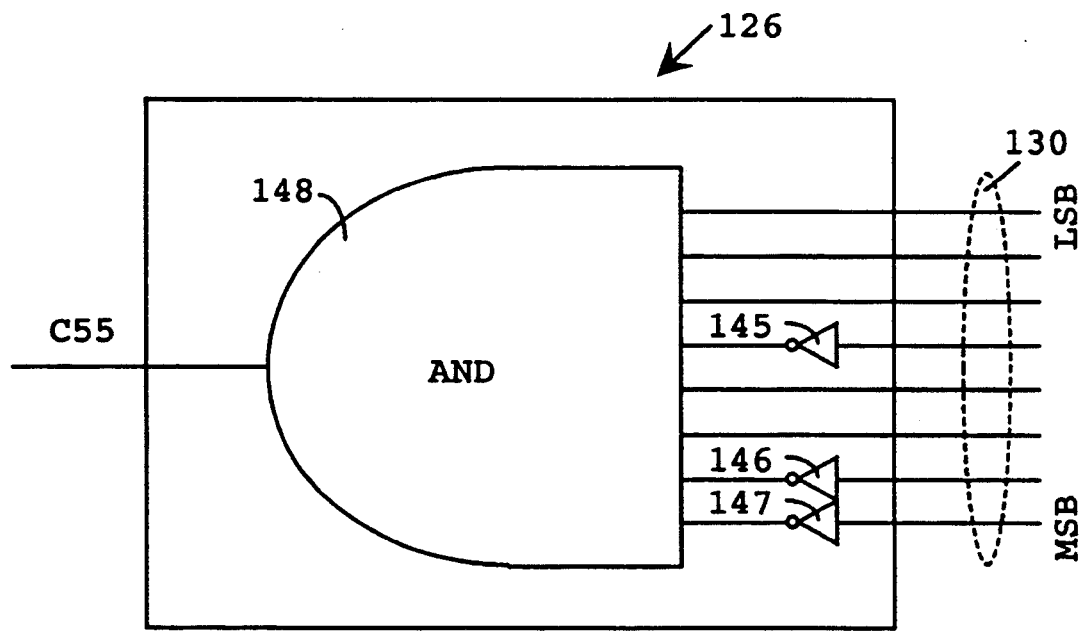
Figure 4D:
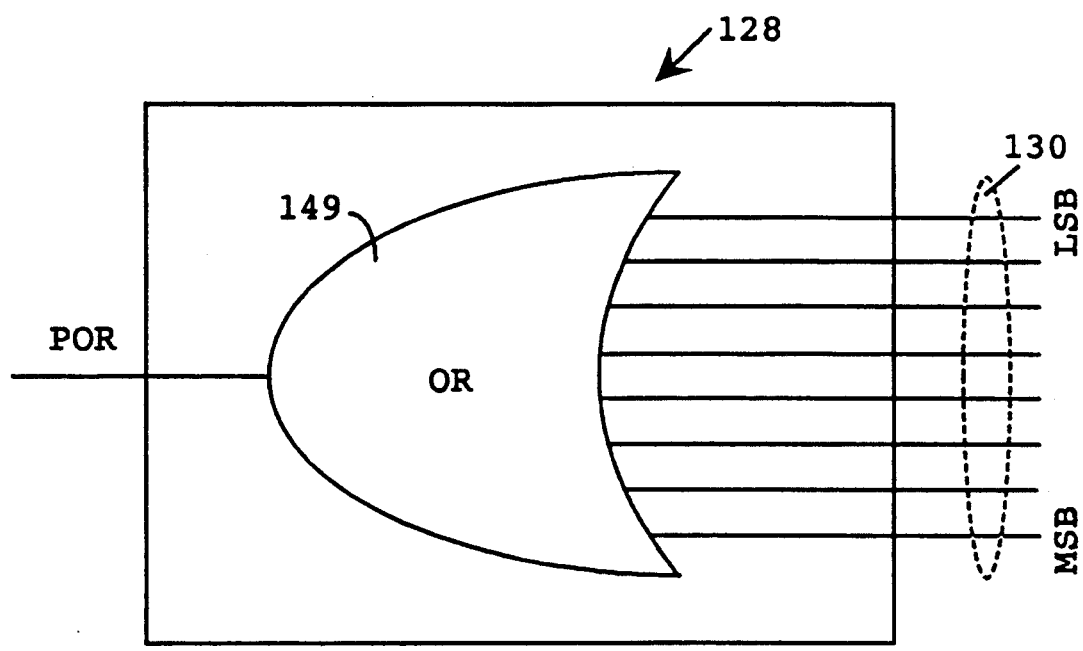

FIG. 3 illustrates, as an example, a more detailed block diagram of the TIMER DELAY circuit 12. A timer delay counter 120 has a set input SET connected to the PUP output of the PWR ON RESET circuit 10, and a clock input KSC connected to the KSC output of the FR OSC circuit 20. Decoder 122 provides a pulse signal to the output C64 of TIMER DELAY circuit 12 when the count of the timer delay counter 120 has decremented to 64 decimal (40 hex), decoder 124 provides a pulse signal to the output C56 of TIMER DELAY circuit 12 when the count of the timer delay counter 120 has decremented to 56 decimal (38 hex), decoder 124 provides a pulse signal to the output C56 of TIMER DELAY circuit 12 when the count of the timer delay counter 120 has decremented to 56 decimal (38 hex), and decoder 128 provides a pulse signal to the output POR of TIMER DELAY circuit 12 when the count of the timer delay counter 120 has decremented to zero (00 hex).

FIGS. 4A-D illustrate, as examples, logic diagrams of the decoder blocks 122, 124, 126 and 128. In the examples, decoders 122, 124 and 126 comprise simple AND gates 138, 144 and 148, respectively, with decoding provided for each decoder by a plurality of inverters, corresponding to the count to be decoded, which are connected to the inputs of their respective AND gates 138, 144 or 148. For example, the output C64 of AND gate 138 is only HIGH when 01000000 binary (40 hex) is provided from an output COUNT of the timer delay counter 120 through bus 130 of the TIMER DELAY circuit 12 to the plurality of inverters 131-137 connected to its inputs; the output C56 of AND gate 144 is only HIGH when 00111000 binary (38 hex) is provided from the output COUNT of the timer delay counter 120 through bus 130 of the TIMER DELAY circuit 12 to the plurality of inverters 139-143 connected to its inputs; and the output C55 of AND gate 148 is only HIGH when 00110111 binary (37 hex) is provided from the output COUNT of the timer delay counter 120 through bus 130 of the TIMER DELAY circuit 12 to the plurality of inverters 145-147 connected to its inputs.

Decoder 128, in the example, is a simple OR gate 149 having inputs connected to the output COUNT of the timer delay counter 120 through bus 130 of the TIMER DELAY circuit 12. The output POR of the OR gate 149 is then only LOW when 00000000 binary (00 hex) is provided from the output COUNT of the timer delay counter 120. Other logic constructions for the decoders 122, 124, 126 and 128 can also be readily devised using the basic concepts presented herein, and are fully contemplated to be included in the full scope of the present invention.

Now referring back to FIG. 1, when the C64 output of the TIMER DELAY circuit 12 goes to a HIGH logic state, this sets the output Q of R-S latch 14 to a HIGH logic state through the S input of the R-S latch 14, which in turn, enables the self-locking counter 16 through its enable input EN. The TIMER DELAY circuit 12 waits until time t1 to enable the self-locking counter 16 instead of immediately enabling it at time t0, in order to ensure that the external crystal resonator 34 has stabilized if the external crystal resonator 34 is connected across pins XTAL-1 and XTAL-2. The self-locking counter 16 thereupon starts to decrement its count from its initial count set at power up, in response to the CPU CLOCK signal received at its clock input CLK from the output CLK of MUX 26. As previously described, initially the MUX 26 passes the first clock signal received at its input I1 from the crystal clock generator 24 to its output CLK. Since the crystal clock generator 24 generates this first clock signal from signals received through input pins XTAL-1 and XTAL-2 from the crystal oscillator circuit 32, a first clock signal will only be present if the crystal oscillator circuit 32 is thus connected. Consequently, the self-locking counter 16 only decrements its count if the crystal oscillator circuit 32 is connected across pins XTAL-1 and XTAL-2, and in effect, acts as an edge detector for detecting state transitions of the CPU CLOCK signal received from the output CLK of the MUX 26.

Although a self-locking counter 16 is used in the preferred embodiment of the present invention to act as an edge detector for detecting state transitions of the CPU CLOCK signal received from the output CLK of the MUX 26, and thus, upon such detection, determine whether or not the crystal oscillator circuit 32 is connected across pins XTAL-1 and XTAL-2, other types of edge detection means are also understood to be contemplated as being covered within the scope of the present invention. For example, a simple flip-flop might also be used in some fashion as an edge detector. Also, certain logic circuitry logically coupling the CPU CLOCK signal with a delayed version of the CPU CLOCK signal might also be implemented in some fashion well known to those skilled in the art to form an edge detector, wherein an example would be providing the CPU CLOCK signal as one input to a NOR gate and an inverted, delayed version of the CPU CLOCK signal as another input to the NOR gate.

Figure 5:
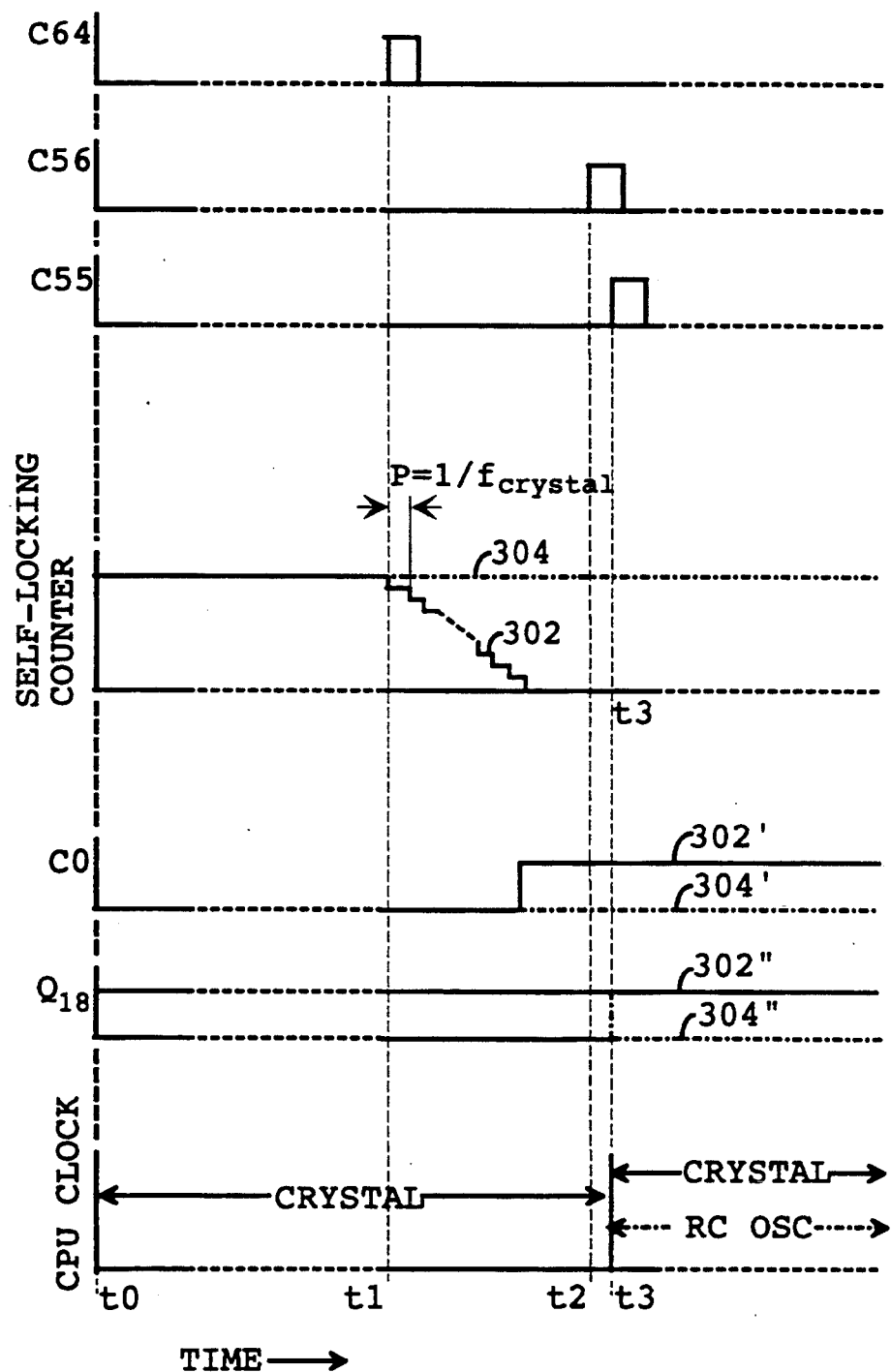
FIG. 5 illustrates, as examples, timing diagrams related to the on-chip, self-configurable clock circuit of FIG. 1.

Referring now to FIG. 5, once the self-locking counter 16 is enabled (e.g., at time t1), it responds to each clock pulse of the CPU CLOCK by decrementing its count value by one until it reaches a count of zero (e.g., staircase function 302). Thereupon, when the count of the self-locking counter 16 reaches zero, the output C0 of the self-locking counter 16 is switched to a logic HIGH state (e.g., step function 302'). However, if there are no clock pulses on the CPU CLOCK, then the self-locking counter 16 maintains its initial count value (e.g., dashed line 304), so that the output C0 of the self-locking counter 16 remains in its initial logic LOW state (e.g., dashed line 304').

Since the CPU CLOCK is initially the crystal clock signal originating from the crystal oscillator circuit 32, clock pulses will only be present on the CPU CLOCK if the crystal oscillator circuit 32 is connected to input pins XTAL-1 and XTAL-2. If there is no crystal oscillator circuit 32 connected to input pins XTAL-1 and XTAL-2, then no clock pulses will be present on the CPU CLOCK.

Accordingly, the self-configurable clock circuit 100 detects whether a crystal oscillator circuit 32 is connected to pins XTAL-1 and XTAL-2 by checking to see whether or not the self-locking counter 16 has decremented itself down to zero (or some other predetermined number) after a sufficient period of time to do so. Such checking is initiated by the TIMER DELAY circuit 12 after its timer delay counter (e.g., 120 in FIG. 3) has counted down, for example, from a count of 64 (40 hex) at time t1 to a count of 55 (37 hex) at time t3. The TIMER DELAY circuit 12 waits until time t3 to check the output C0 of the self-locking counter 16 instead of immediately after time t1 to ensure that the self-locking counter 16 has had sufficient time to respond to the CPU CLOCK signal received from the output CPU from the MUX 26. Also, immediately prior to time t3, the TIMER DELAY circuit 12 disenables the self-locking counter 16 to stop decrementing when the timer delay counter (e.g., 120 in FIG. 3) has counted down, for example, to a count of 56 (38 hex) at time t2.

To better appreciate the timing involved in the circuit, the following example is provided. If the self-locking counter 16 includes a 4-bit internal counter, then it would take 16 pulses, each with a pulse period of ($1/f_{crystal}$), before the self-locking counter 16 counts down to zero. Assuming a $f_{crystal}$ value of 10 MHz., this time calculates to be 1.6 $\mu$sec. Therefore, checking of the output C0 of the self-locking counter 16 in the present example should be initiated no sooner than 1.6 $\mu$sec. after enabling the self-locking counter 16. Since the timer delay counter (e.g., 120 in FIG. 3) of the TIMER DELAY circuit 12 decrements one count upon each pulse of the free running clock signal, and the free running clock signal is assumed in the present example to have a $f_{FRO}$ Value of 1 MHz., then the timer delay counter (e.g., 120 in FIG. 3) of the TIMER DELAY circuit 12 should decrement at least two counts before initiating checking of the output C0 of the self-locking counter 16.

At time t3, the TIMER DELAY circuit 12 enables the transparent D-latch 18 through its enable input EN, to pass from its input D, the output C0 of the self-locking counter 16, to its output Q (referred to herein and designated as, in FIG. 5, "$Q_{18}$"). Since the output C0 of the self-locking counter 16 will only be at a logic HIGH state if the crystal oscillator circuit 32 is connected to pins XTAL-1 and XTAL-2 at time 3, and will be in a logic LOW state if it is not, then output $Q_{18}$ will also only be in a logic HIGH state when the crystal oscillator circuit 32 is connected to pins XTAL-1 and XTAL-2 (e.g., step function 302") and will be in a logic LOW state when it is not (e.g., dashed line 304").

Multiplexer 26 thereupon receives the Q output signal of the transparent D-latch 18 at its select input S. When the select input S of the multiplexer 26 is in a logic HIGH state, i.e., when C0 is in a logic HIGH state, indicating that a crystal oscillator circuit 32 is connected to pins XTAL-1 and XTAL-2, the multiplexer 26 passes the first clock signal to its output CLK and accordingly, the first clock signal generated by the off-chip, crystal oscillator circuit 32 becomes the system clock signal, CPU CLOCK. On the other hand, when the select input S of the multiplexer 26 is in a logic LOW state, i.e., when C0 is in a logic LOW state, indicating that the crystal oscillator circuit 32 is not connected to pins XTAL-1 and XTAL-2, the multiplexer 26 passes the second clock signal generated by the on-chip, RC oscillator circuit 22 in combination with the off-chip, resistor circuit 30, to its output CLK and accordingly, the second clock signal becomes the system clock signal, CPU CLOCK. This is further illustrated in the CPU CLOCK timing diagram of FIG. 5, wherein before time t3, the CPU CLOCK is shown to be the crystal clock signal (e.g., first clock signal), and after time t3, the CPU CLOCK is shown to be either the crystal clock signal (e.g., first clock signal) or the RC oscillator clock signal (e.g., second clock signal), depending upon whether the output Q of the transparent D-latch 18 is in a logic HIGH state (e.g., solid line 302") or in a logic LOW state (e.g., dashed line 304").

Figure 6:
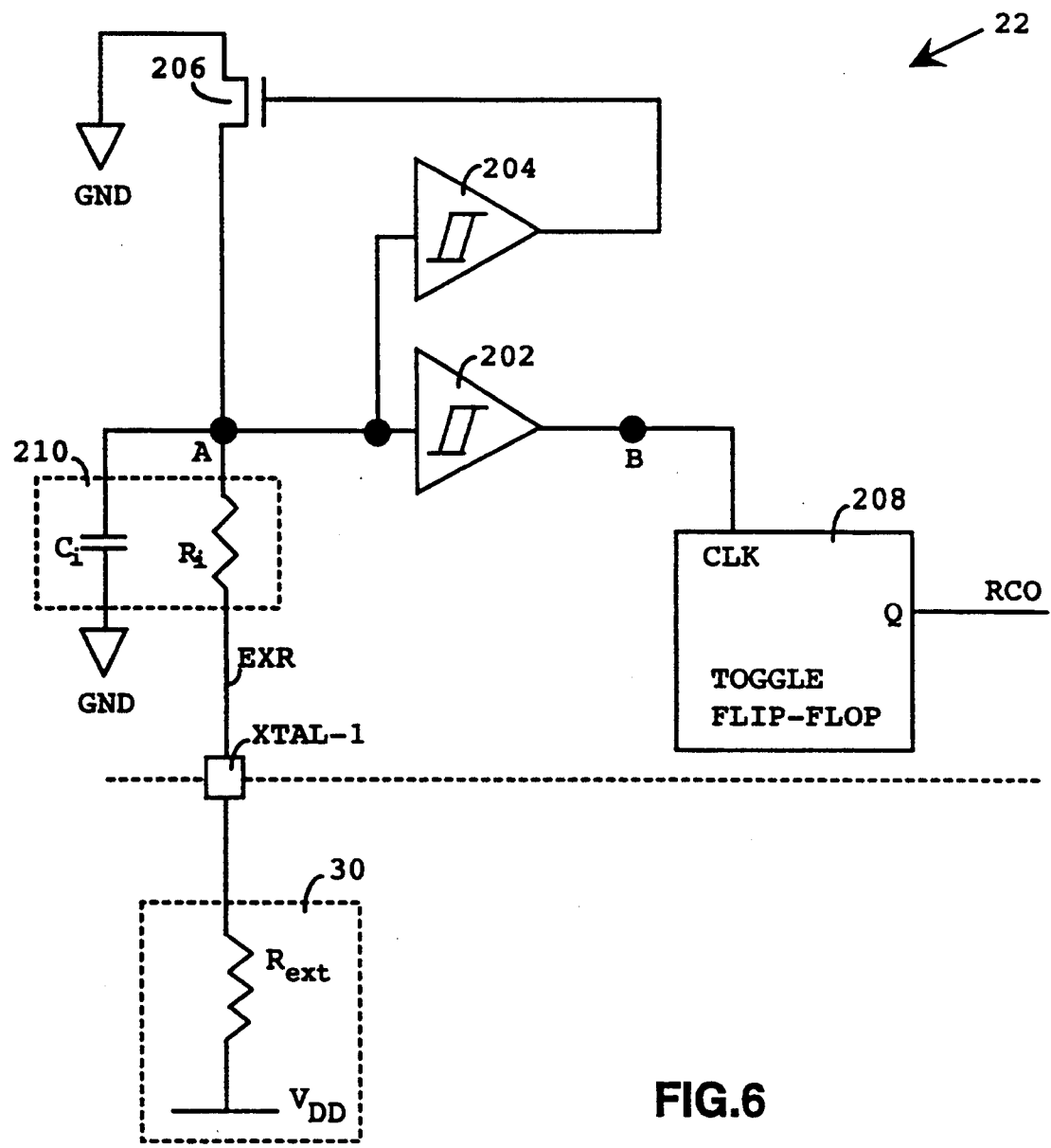
FIG. 6 illustrates, as an example, a free running oscillator circuit for the on-chip, self-configurable clock circuit of FIG. 1.
Figure 7:
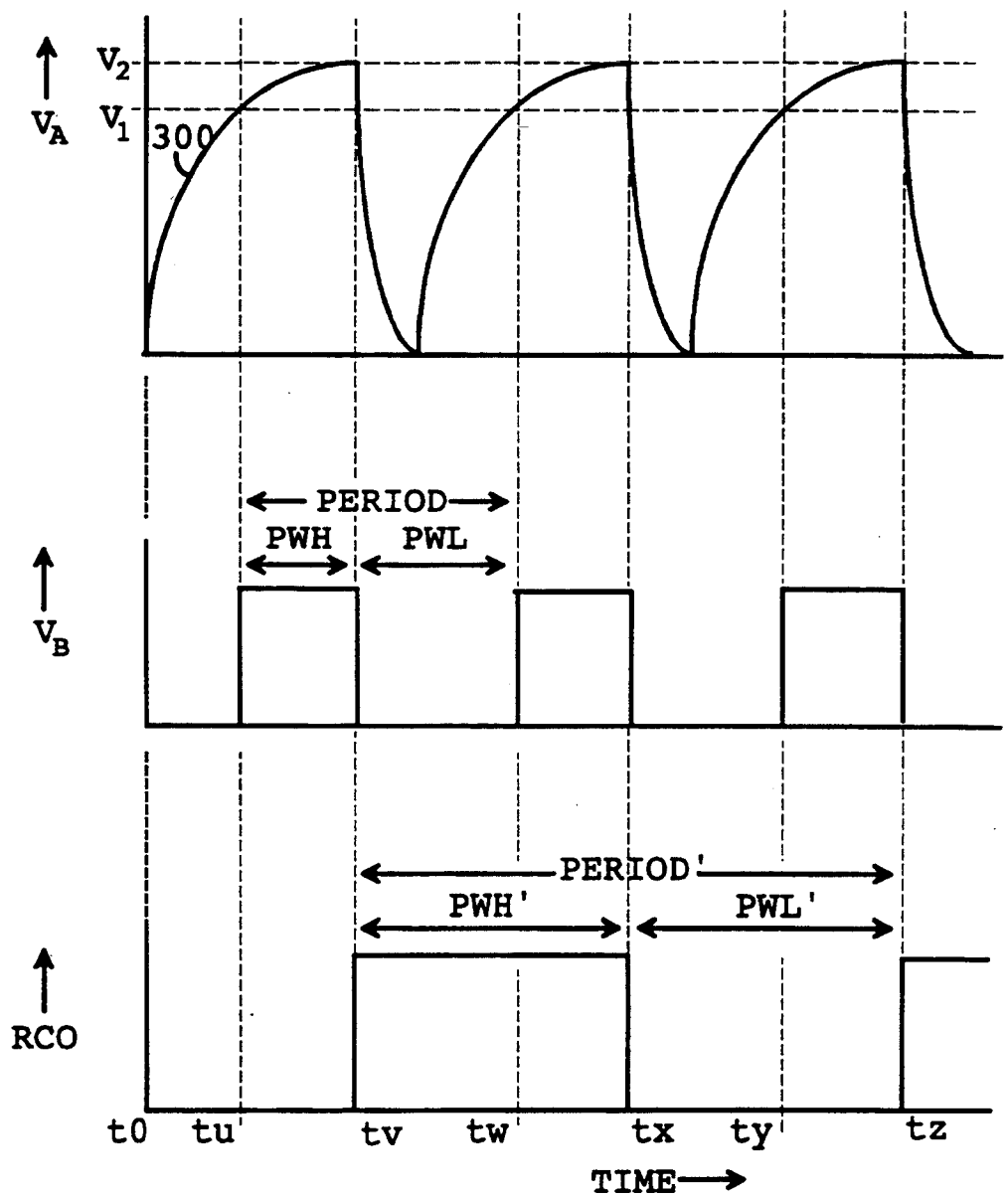
FIG. 7 illustrates, as examples, timing diagrams related to the free running oscillator circuit of FIG. 6.

FIGS. 6 and 7 illustrate, as examples, generation of the RC oscillator clock signal being transmitted through the output RCO of the RC OSC circuit 22 by the RC OSC circuit 22 acting in combination with the resistor circuit 30. As will be described, by allowing external resistance (e.g., $R_{ext}$) to be added to the RC OSC circuit 22, the frequency ("$f_{RCO}$") of the RC oscillator clock signal can be externally adjusted, which provides not only more accurate tuning to a desired $f_{RCO}$, but also, a broader, tunable range of values for $f_{RCO}$, then would be possible if a fixed resistance was provided on the chip.

Referring first to FIG. 6, an example of an RC OSC circuit 22 is shown which includes internal, line related resistance and capacitance lumped to together for illustrative purposes in box 210; a first Schmitt-trigger 202 having a first threshold voltage $V_1$, an input connected to node A, and an output connected to node B; a second Schmitt-trigger 204 having a second threshold voltage $V_2$ which is higher than the first threshold voltage $V_1$ of the first Schmitt-trigger 202, an input connected to node A, and an output; a discharge transistor 206 having a control gate connected to the output of the second Schmitt-trigger 202, a drain electrode connected to node A, and a source electrode connected to ground; and a toggle flip-flop 208 acting as a divide-by-2 circuit having an input connected to node B and an output providing the output RCO of the RC OSC circuit 22.

An external voltage source $V_{DD}$ is connected through the external, precision resistor $R_{ext}$ to pin XTAL-1, which is in turn, connected to an input EXR of the RC OSC circuit 22. As a result thereof, the voltage $V_A$ at node A (e.g., curve 300 in FIG. 7) rises according to an RC time constant determined by the combination of the internal, line related resistance and capacitance, and the external, precision resistor $R_{ext}$. When the voltage $V_A$ rises to the first threshold voltage $V_1$ of the first Schmitt-trigger 202, the first Schmitt-trigger 202 switches ON and its output, at node B, is accordingly switched to a logic HIGH state (e.g., the voltage $V_B$ at node B is shown in FIG. 7 to switch to a logic HIGH state voltage level at time tu).

The voltage $V_A$ at node A thereupon continues to rise until it reaches the second threshold voltage $V_2$ of the second Schmitt-trigger 204. When this occurs, the second Schmitt-trigger 204 switches ON and its output is accordingly switched to a logic HIGH state. Since the output of the second Schmitt-trigger 204 is connected to the control gate of the discharge transistor 206, when the output of the second Schmitt-trigger 204 goes HIGH, it therefore causes the discharge transistor 206 to discharge the voltage $V_A$ at node A to ground (e.g., the voltage $V_A$ at node A is shown in FIG. 7 to drop back to ground at time tv).

When the discharge transistor 206 causes the voltage $V_A$ at node A to drop back to ground, this causes both Schmitt-trigger 202 and 204 to switch OFF again. The voltage $V_A$ at node A is thereupon allowed to charge up again as previously described, and the resulting cycling of such charging and discharging of the voltage $V_A$ at node A thereupon generates a clock signal having a period, and high and low pulse widths ("PWH" and "PWL") such as those shown for the voltage $V_B$ at node B. By connecting the voltage $V_B$ to the clock input CLK of the toggle flip-flop 208, a clock signal RCO having a 50% duty cycle (e.g., PWH' equal to PWL') is then generated as shown in FIG. 7.

The period of the resulting clock signal, as seen at node B, can be adjusted by selecting different values for the external, precision resistor $R_{ext}$. For example, by increasing the value of the resistor $R_{ext}$, the resulting RC time constant for the voltage $V_A$ as it rises at node A will correspondingly get larger, and as a result thereof, the time between pulses will correspondingly get longer and the frequency of the resulting clock signal get correspondingly slower. Conversely, by reducing the value of the resistor $R_{ext}$, the resulting RC time constant will correspondingly get smaller, and as a result thereof, the time between pulses will correspondingly get shorter and the frequency of the resulting clock signal get correspondingly faster.

Although the various aspects of the present invention have been described with respect to a preferred embodiment, it will be understood that the invention is entitled to full protection within the full scope of the appended claims.

What is claimed is:

1. In an integrated circuit chip, a self-configurable clock circuit for selecting as a system clock signal either a first clock signal generated from an external crystal oscillator or a second clock signal generated from an on-chip R-C oscillator circuit, wherein said self-configurable clock circuit in response to a power up signal selects said first clock signal if said external crystal oscillator is connected to said integrated circuit chip and selects said second clock signal if said external crystal oscillator is not connected to said integrated circuit chip, said self-configurable clock circuit comprising:

edge detection means for detecting a state transition of said first clock signal, and generating an output initially set by said power up signal and indicative of said detected state transition; and a logic circuit having a first input connected to said first clock signal, a second input connected to said second clock signal, a third input connected to said output of said edge detection means, and an output providing said system clock signal, wherein said output of said edge detection means causes said output of said logic circuit to be said first clock signal if said external crystal oscillator is connected to said integrated circuit chip and causes said output of said logic circuit to be said second clock signal if said external crystal oscillator is not connected to said integrated circuit chip.

2. The self configurable clock circuit as recited in claim 1, wherein said edge detection means includes at least one flip-flop having an output initially set by said power up signal and responsive to said first clock signal so that said output only changes from its initial setting if said external crystal oscillator is connected to said integrated circuit chip.

3. The self configurable clock circuit as recited in claim 1, wherein said edge detection means includes:

a delay means for receiving said first clock signal, and generating a delayed version of said first clock signal; and a logic means for receiving said first clock signal and said delayed version of said first clock signal, and generating an output in response thereof, wherein said output is indicative of a state transition of said first clock signal.

4. The self configurable clock circuit as recited in claim 1, further comprising a counter circuit wherein said edge detection means includes a counter circuit.

5. The self configurable clock circuit as recited in claim 4, wherein said counter circuit is a first self-locking counter circuit having an output initially set to a first maximum value by said power up signal and in response to said first clock signal, decremented until said first self-locking counter circuit output reaches a first minimum value, whereupon said output locks at said first minimum value until said output of said first self-locking counter circuit is reinitialized by said power up signal.

6. The self configurable clock circuit as recited in claim 5, said edge detection means and said logic circuit each having an enable input, and said self configurable clock circuit further comprising:

a free running oscillator circuit generating a free running clock signal;

a timer delay circuit, responsive to said free running clock signal, having first and second outputs, each initially set by said power up signal and responsive to said free running clock signal, wherein said first output causes said edge detection means, through said enable input of said edge detection means, to be enabled after a first time period sufficient to ensure that said external crystal oscillator has stabilized, and said second output causes said logic circuit, through said enable input of said logic circuit, to be enabled after a second time period following said first time period, wherein said second time period is sufficient to ensure that said output of said edge detection means has changed from its initial setting if said external crystal oscillator is connected to said integrated circuit chip.

7. The self configurable clock circuit as recited in claim 6, further comprising an R-S latch having a set input connected to said first output of said timer delay circuit, and an output initially set by said power up signal and connected to an enable input of said first self-locking counter circuit.

8. The self configurable clock circuit as recited in claim 7, said R-S latch having a reset input and said timer delay circuit having a third output connected to said reset input of said R-S latch, wherein said timer delay circuit comprises:

a second self-locking counter circuit having an output initially set to a maximum count by said power up signal and in response to said free running clock signal, decremented until said output reaches a minimum count, whereupon said output locks at said minimum count until said output of said second self-locking counter is reinitialized by said power up signal;

a first decoder circuit connected to said output of said second self-locking counter circuit, said first decoder circuit providing said first output of said timer delay circuit such that said first output is activated when said output of said second self-locking counter circuit equals a first count corresponding to said first period of time;

a second decoder circuit connected to said output of said second self-locking counter circuit, said second decoder circuit providing said second output of said timer delay circuit such that said second output is activated when said output of said second self-locking counter circuit equals a second count corresponding to said second period of time following said first period of time; and a third decoder circuit connected to said output of said second self-locking counter circuit, said third decoder circuit providing said third output of said timer delay circuit such that said third output is activated when said output of said second self-locking counter circuit equals a third count corresponding to one count less than said second count.

9. The self configurable clock circuit as recited in claim 5, wherein said logic circuit comprises a multiplexer circuit having a first input connected to said first clock signal, a second input connected to said second clock signal, a select input, and an output providing said system clock signal, wherein said output of said edge detection means causes, through said select input, said multiplexer circuit to pass said first clock signal to said multiplexer output if said external crystal oscillator is connected to said integrated circuit chip and said second clock signal to said multiplexer output if said external crystal oscillator is not connected to said integrated circuit chip.

10. The self configurable clock circuit as recited in claim 9, wherein said logic circuit further comprises a latch circuit having an input connected to said output of said first self-locking counter circuit, and an output initially set by said power up signal and connected to said select input of said multiplexer circuit.

11. The self configurable clock circuit as recited in claim 10, said edge detection means and said latch circuit each having an enable input, and said self configurable clock circuit further comprising:

a free running oscillator circuit generating a free running clock signal;

a timer delay circuit, responsive to said free running clock signal, having first and second outputs, each initially set by said power up signal and responsive to said free running clock signal, wherein said first output causes said edge detection means, through said enable input of said edge detection means, to be enabled after a first time period sufficient to ensure that said external crystal oscillator has stabilized, and said second output causes said latch circuit, through said enable input of said latch circuit, to be enabled after a second time period following said first time period, wherein said second time period is sufficient to ensure that said output of said edge detection means has changed from its initial setting if said external crystal oscillator is connected to said integrated circuit chip.

12. The self configurable clock circuit as recited in claim 1, further comprising at least one input electrically connected to said external crystal oscillator if said external crystal oscillator is connected to said integrated circuit chip and electrically connected to a voltage supply through a precision resistor if said external crystal oscillator is not connected to said integrated circuit chip, wherein the frequency of said second clock signal can be adjusted by a resistance value of said precision resistor.

13. The self configurable clock circuit as recited in claim 12, wherein said on-chip R-C oscillator circuit comprises:

a first Schmitt-trigger having a first switch point, said first Schmitt-trigger having an input connected to said at least one input at a node, and an output;

a toggle flip-flop having a clock input connected to said output of said first Schmitt-trigger and an output providing said second clock signal;

a second Schmitt-trigger having a second switch point higher than said first switch point of said first Schmitt-trigger, said second Schmitt-trigger having an input also connected to said node, and an output; and a discharge transistor connected to said node and to ground, and having a gate connected to said output of said second Schmitt-trigger, so that when a voltage on said node reaches said second switch point, said discharge transistor discharges said voltage to ground.

14. A method of selecting as a system clock signal for an integrated circuit chip either a first clock signal generated from an off-chip crystal oscillator if said off-chip crystal oscillator is connected to an input of said integrated circuit chip or a second clock signal generated from an on-chip R-C oscillator circuit if said off-chip crystal oscillator is not connected to said input of said integrated circuit chip, said method comprising the steps of:

detecting a state transition of said first clock signal; and selecting as said system clock signal said first clock signal if said state transition is detected, or said second clock signal if said state transition is not detected.

15. The method as recited in claim 14, wherein said detecting step comprises the step of detecting a state transition of said first clock signal after a first period of time sufficient to ensure that said off-chip crystal oscillator has stabilized.

16. The method as recited in claim 15, wherein said detecting step comprises the steps of:

initializing an output of an edge detection circuit in response to a power up signal; and connecting said first clock signal to said edge detection circuit such that said output of said edge detection circuit changes state upon detection of a state transition of said first clock signal.

17. The method as recited in claim 16, wherein said selecting step comprises the step of selecting as said system clock signal said first clock signal if said output of said edge detection circuit has changed from its initialized state after a second period of time, and selecting said second clock signal if said output of said edge detection circuit has not changed from its initialized state after said second period of time.

18. The method as recited in claim 14, further comprising the step of generating a power on reset signal after said selection step, to indicate that said system clock signal is available.

* * * * *